United States Patent [19]
Pan et al.

[11] Patent Number: 5,556,806
[45] Date of Patent: Sep. 17, 1996

[54] SPIN-ON-GLASS NONETCHBACK PLANARIZATION PROCESS USING OXYGEN PLASMA TREATMENT

[75] Inventors: Sheng-Liang Pan; Hsien-Wen Chang, both of Hsin-Chu; Chien-Fong Chen, Taichung, all of Taiwan

[73] Assignee: Taiwan Semiconductor Manufacturing Company, Hsin-Chu, Taiwan

[21] Appl. No.: 496,017

[22] Filed: Jun. 28, 1995

[51] Int. Cl.[6] .................................................. H01L 21/28
[52] U.S. Cl. .......................... 437/195; 437/231; 437/238; 437/977
[58] Field of Search ................................. 437/195, 231, 437/238, 946, 977

[56] References Cited

U.S. PATENT DOCUMENTS

| | | | |
|---|---|---|---|
| 4,894,351 | 1/1990 | Batty | 437/195 |
| 5,003,062 | 3/1991 | Yen | 437/231 |
| 5,252,515 | 10/1993 | Tsai et al. | 437/231 |
| 5,270,259 | 12/1993 | Ito et al. | 437/231 |
| 5,270,267 | 12/1993 | Ovellet | 437/231 |
| 5,334,554 | 8/1994 | Lin et al. | 437/231 |
| 5,366,910 | 11/1994 | Ha et al. | 437/231 |
| 5,403,780 | 4/1995 | Jain et al. | 437/231 |
| 5,413,963 | 5/1995 | Yen et al. | 437/195 |
| 5,424,244 | 6/1995 | Zheng et al. | 437/173 |

*Primary Examiner*—George Fourson
*Assistant Examiner*—Thomas G. Bilodeau
*Attorney, Agent, or Firm*—George O. Saile; William J. Stoffel

[57] ABSTRACT

An improved method is described for planarizing dielectric layers which are formed between conductor layers in integrated circuits A three layer spin-on-glass sandwich is formed comprising a first silicon oxide layer, a spin-on-glass layer and a second silicon oxide layer. The improvement comprises performing an $O_2$ plasma treatment on the first silicon oxide layer prior to forming the overlying spin-on-glass layer. The method prevents delamination (separation) between the first silicon oxide layer and the middle spin-on-glass layer.

21 Claims, 2 Drawing Sheets

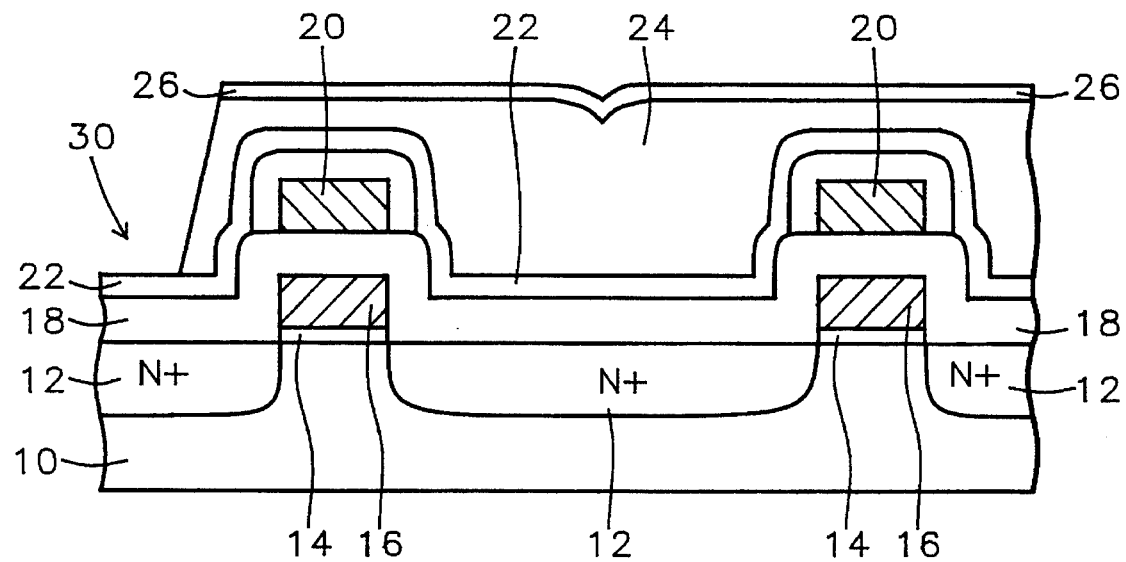
FIG. 1 – Prior Art
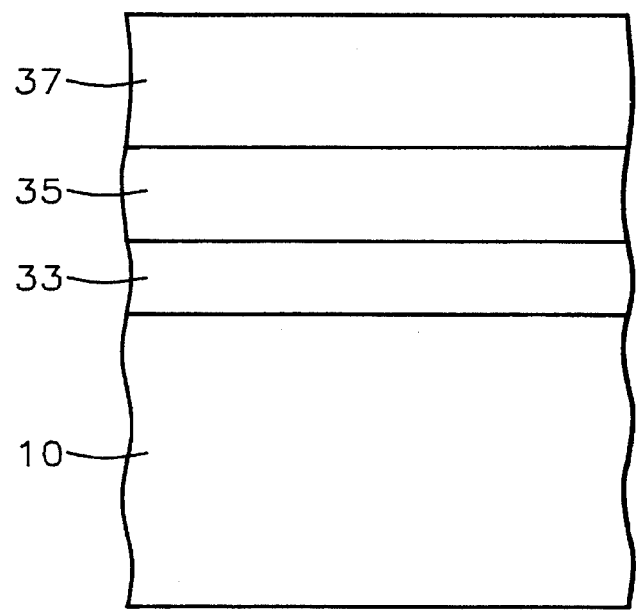
FIG. 2

SPIN-ON-GLASS NONETCHBACK PLANARIZATION PROCESS USING OXYGEN PLASMA TREATMENT

BACKGROUND OF THE INVENTION

1) Field of the Invention

The invention relates to planarization of the dielectric layers within the multilayer metallization which separate conductive layers. The planarization involves nonetchback spin-on-glass techniques.

2) Description of the Prior Art

The top surface of semiconductor substrates is irregular because of the formation of gate electrodes, resistors, capacitors, conductors, etc. Planarizing layers, such as spin on glass layers, are used to smooth the surface so that subsequent metal and insulation layers may be formed. Planarizing layers are often formed in a three layer spin-on-glass sandwich structure comprising: (1) a bottom first insulating layer, (2) a center spin on glass (SOG) layer, and (3) a top second insulating layer. A problem with the current spin-on-glass sandwich structures/processes is that the first insulating layer and the spin-on-glass layer separate or delaminate. This delamination causes the reliability and yield problems with the devices.

FIG. 1 shows a planarized multilayer metallization structure. There is shown a semiconductor substrate 10 having N type diffused regions 12 therein. Polysilcon gate structures composed of the gate dielectric 14 and gate electrode or conductor 16 are formed on the surface of the substrate 10 and cooperate with the diffused regions to act as MOSFET devices. An insulating or dielectric layer 18 layer is formed thereover by conventional means. A conductor layer 20 has been deposited and patterned by lithography and etching. The spin-on-glass sandwich layer 22, 24, 26 composed of: (1) a first silicon oxide like layer 22, (2) spin-on-glass (SOG) layer 24 and (3) a second silicon oxide like layer 26. A delamination area 30 is shown where the spin-on-glass layer 22 delaminates from first silicon oxide layer 22. The spin-on-glass layer 24 and layers formed above the spin-on-glass layer detach. The delamination area 30 is often caused by shear stress exerted by the package. This delamination problem can be detected in standard temperature cycle tests where the air temperature is varied between −65° C. and 150° C. The delamination problem causes yield and reliability problems, such as complete circuit fails caused by the missing circuits above the delmaination area 30.

U.S. Pat. No. 5,003,062, Yen describes an improved method to form a Spin-on-Glass sandwich using more than one SOG layer deposition and curing step to build the required middle SOG layer thickness. However, the patent does not address the delamination problem between the first silicon oxide layer and the SOG layer.

SUMMARY OF THE INVENTION

There are many manufacturing advantages to the use of a non-etchback spin-on-glass as the dielectric interlayer for multilayer metallization structures in the highly dense, submicron integrated circuit devices. Delamination between the first oxide layer and middle SOG layers during temperature cycling has become a very serious problem. This delamination problem causes yield reductions and reliability problems.

It is an object of the present invention to provide a method of forming a spin-on-glass sandwich which prevents the delamination of the first oxide layer and middle SOG layer during temperature cycling.

In accordance with the above objectives, an improved process for forming a spin-on-glass sandwich which prevents delamination between the first oxide layer and the SOG layer is provided. The method begins with the integrated circuit intermediate product having devices, such as FETs or bipolar formed therein, but before interconnection metal has been formed on the principal surface of the product. The principal surface has a patterned conductive layer at its surface.

The three layer spin-on-glass sandwich is formed by depositing a first silicon oxide layer over the patterned conductor layer. The first silicon oxide layer is preferably formed with a plasma enhanced chemical vapor deposition (PECVD) process. The first oxide layer is then treated with plasma, preferably an $O_2$ plasma. The $O_2$ plasma treatment is preferably performed in a barrel type photoresist tool at a temperature less than about 210° C. for about 15 minutes. The $O_2$ plasma treatment roughens the oxide surface and reduces the moisture content of the first oxide layer. The rougher and dryer oxide surface increases the adhesion between the first oxide layer and the spin-on-glass layer thus preventing the delamination problem.

Next, a spin-on-glass layer is formed over the first oxide layer. The SOG layer can be formed with a one or multiple step deposition/bake/degassing process. The SOG layer is preferably formed with a siloxane using a double coating process and preferably has an overall thickness of about 3150 Å. A first layer of spin-on-glass having a thickness of less than about 1575 Å is deposited upon the first silicon oxide coating. The layer is baked at a temperature of less than about 350 degrees C. Next, the layer is vacuum degassed at less than about 100 mtorr and 350 degrees C. The spin-on-glass layer process just given is repeated for subsequent layers of spin-on-glass until the desired thickness of planarized spin-on-glass dielectric layer has been formed. The layers are then cured at a temperature of less than about 500 degrees C.

The second layer of silicon oxide is then formed over the spin-on-glass dielectric layer completes the planarization. The second silicon oxide layer is preferably formed with a PECVD process and has a thickness of about 5000 Å. A vacuum degassing step is performed just before the deposition of the next conductor layer. Additional conductive and passivation layer can be formed overlying this structure.

The $O_2$ plasma treatment of the present invention prevents the delamination between the first oxide layer and the spin on glass layer. The $O_2$ plasma treatment roughens the surface of the first silicon oxide layer which dramatically increase the surface area thereby improving the adhesion of the spin on glass layer. The treatment also reduced the moisture content to the bulk first oxide layer further improving adhesion to the spin on glass layer.

BRIEF DESCRIPTION OF THE DRAWINGS

The drawings show the following:

FIG. 1 shows the conventional three layer spin-on-glass sandwich structure having the delamination problem between the first oxide layer and the spin-on-glass layer.

FIG. 2 shows a vertical cross-sectional drawing that shows the results of spin-on-glass processing by the procedures of the present invention.

DETAILED DESCRIPTION OF THE PREFERRED EMBODIMENTS

Figure 3:
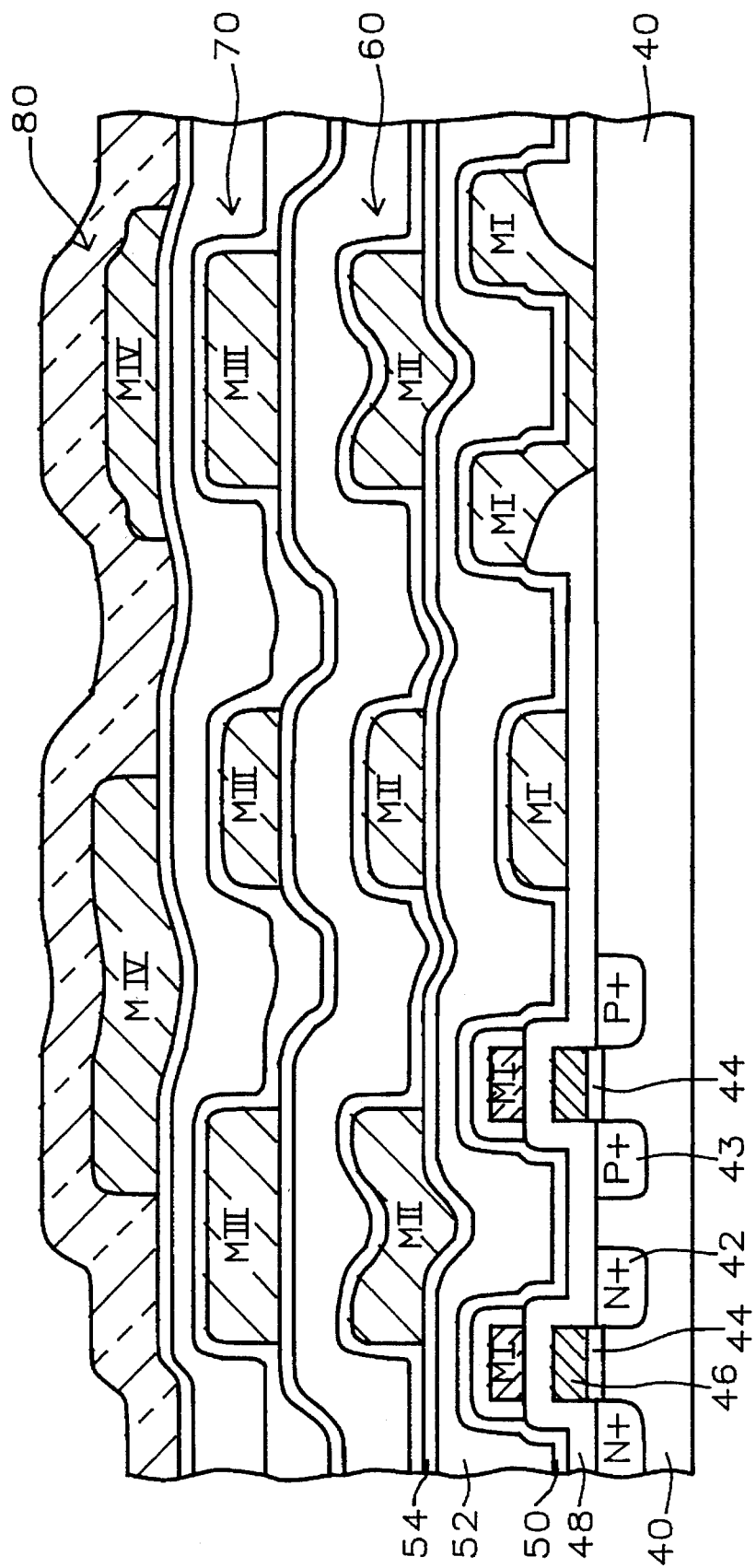
FIG. 3 shows a vertical cross-sectional drawing that shows the results of spin-on-glass processing by the procedures of the present invention in a multi-layered structure.

The present invention will be described in detail with reference to the accompanying drawings. It should be noted that the drawings are in greatly simplified form. In practice the semiconductor device structure will be one of many supported on a common substrate connected with suitable metallurgy in various electronic electric circuit configurations. The substrate 10 shall be a monocrystalline silicon semiconductor body with many devices fabricated therein, as is well known in the art. The substrate 10 is preferably formed of monocrystalline silicon preferably having a crystalline orientation of <1 0 0>. The background substrate dopant is of first conductivity type, and preferably P-type, preferably with boron impurity with a concentration in the range of 5E15 to 5E17 atoms/cm$^3$.

The sandwich structure described in this invention as a non-etchback planarization technique includes three (or more layers), that is a first silicon oxide or the like layer 33 on the surface to be planarized, a middle spin-on-glass layer 35 thereover which can be formed by depositing one or more spin-on-glass coats and a second silicon oxide or the like layer 37 thereover. See FIG. 2. Each of these layers has a specific purpose.

The first silicon oxide or the like layer, serves as an adhesion and a hillock suppression layer between the patterned conductor, such as a metal layer that it is deposited upon and the spin-on-glass layer that will be deposited thereover. It also, of course prevents the spin-on-glass material from being in contact with the patterned conductor.

The second layer 35 of the sandwich is the spin-on-glass composite of spin-on-glass coatings. Its function is to serve as the planarization layer of the sandwich. It is usually necessary to use two or more coatings of spin-on-glass to provide the best possible planarization. After the curing of this layer, the resulting layer is similar to silicon oxide. This layer may be doped with N or P type dopants to relieve stress.

The final silicon oxide or the like layer 37 serves as an isolation layer. It isolates the spin-on-glass layer from the next conductive layer level.

The process to form the three layer spin-on-glass (SOG) sandwich begins by depositing a first silicon oxide layer over the patterned conductor layer 10 as shown in FIG. 2. The first silicon oxide layer 33 is preferably formed with a plasma enhanced chemical vapor deposition (PECVD). The first silicon oxide layer can be formed by any process, such as a conventional atmospheric pressure chemical vapor deposition. The first silicon oxide layer 33 can have a thickness in the range of about 1750 to 2250 Å and more preferably a thickness of about 2000 Å.

Next, the first oxide layer 33 is then treated with a gas plasma, preferably an O$_2$ plasma. The O$_2$ plasmas treatment is preferably performed in a barrel type photoresist tool such as an resist stripper tool manufactured by Plasma Systems Corporation (PSC). The tool employs a low pressure electrical discharge to split molecular oxygen (O$_2$) into its more reactive atomic form (O ions). The oxygen ions then convert any organic compounds (such as residual photo resist or other contamination) into gaseous products that can be pumped away. Most barrel reactors (such as a plasma stripper) operate in a pressure range of 0.5 to 1.0 torr and have external electrodes and a 13.56 mHz quartz power supply. The wafers can be stacked horizontally and surrounded by a shield to reduce the wafer exposure to the charged species in the plasma. In addition, a descum process can be used to clear organic and photoresist residue from contact holes before the plasma treatment.

In the consequential step, the first oxide layer 33 surface is plasma treated at a temperature between about 180° and 210° C. and preferably less than about 210° C. for a time between about 12 and 13 minutes and more preferably about 15 minutes. The plasma process preferably is performed at about: a power of 500 watts, pressure of 800 mtorr and O$_2$ flow of 500 sccm for about 15 minutes, when the temperature rises above 80° C., the plasma turns on, after 2 to 3 minutes, the temperature stabilizes at about 180° to 210° C. An atomic force microscope (AFM) can be used to check the first oxide surface after the plasma etch to ensure that the surface is adequately roughened.

The plasma treatment roughens the oxide surface and reduces the moisture content of the first oxide layer. The rougher and dryer oxide surface increases the adhesion between the first oxide layer and the spin-on-glass layer thus preventing the delamination problem.

Next, a spin-on-glass layer 35 is formed over the first oxide layer. The SOG layer 35 can be formed with a one or multiple step deposition/bake/degassing process. The SOG layer is preferably formed with a siloxane using a double coating process and has an overall thickness of about 3150 Å. The most useful SOG materials are silicates-Si(OH)$_4$ and siloxanes-RSi(OH)$_{4-n}$. Preferably a siloxane is used. The material to be applied is thoroughly mixed in a suitable solvent which is usually a combination of a high boiling point solvent and a low boiling point solvent. The preferred low boiling point solvents are methanol, ethanol, and propanol. The middle boiling point solvents are buthanol, penthanol, hexanol and methyl celloslve. The high boiling point solvents are butylcelloslve, propylenglycol, diethyleneglycol and carbindol. Other potential vehicles or solvents are NMP, HMPA, N-dimethylacetoamide, acetyl acetone, and malonic acid diethylester and the like.

The spin-on-glass material suspended in the vehicle or solvent is deposited onto the semiconductor wafer surface and uniformly spread thereover by the action of spinning the wafer. Most of the vehicle or solvent is driven off by a low temperature baking step, performed preferably at a temperature less than about 350° C. for about 1 to 2 minutes and at a pressure of about 100 mtorrs. At this point, the vacuum degassing step is accomplished by subjecting the wafer to a vacuum of less than about 100 mtorr and 350 degrees C. This last step removes chemical materials which could during latter processing cause cracking and corrosion of the next level conductor material. Other coatings of the spin-on-glass material are applied, baked and vacuum degassed until the desired spin-on-glass layer is formed.

The final step in the making of the spin-on-glass layer 35 is curing. Curing is performed in a high temperature heating step to cause the breakdown of the silicate or siloxane material to a silicon oxide like cross linked material. Water in the form of steam is the major reaction product of this reaction. The silicate spin-on-glass is preferably cured at about 390 degrees C. and siloxane spin-on-glass is cured at about 450 degrees C. in nitrogen.

The SOG layer 35 can optionally be treated with a plasma treatment to roughen the SOG surface to improve the adhesion between the SOG layer 35 and the second oxide layer 37. This treatment can be any conventional plasma treatment as described above or preferably a $N_2O$ plasma treatment. The treatment can prevent the delamination problem between the SOG layer 35 and the second oxide layer 37.

Next, the second silicon oxide layer 37 is formed over the SOG layer. The second silicon oxide layer 33 is preferably formed with a plasma enhanced chemical vapor deposition (PECVD). The second silicon oxide layer can have a thickness in the range of about 4300 to 5700 Å and more preferably a thickness of about 5000 Å.

Referring now to FIG. 3, the illustrated shows that at least 4 levels of metallization in an integrated circuit semiconductor device can be produced by the method of the present invention without the prior art delamination failure problems described in relation to the FIG. 1. Conventional semiconductor processes for the manufacture of submicron integrated circuit devices are used to form within the semiconductor substrate 40 which is typically (100) oriented silicon, but could be another semiconductor material such as gallium arsenide. The processes can be used to form, for example MOSFET devices which may be N channel, P channel or CMOS, or bipolar devices or a combination of such devices, BICMOS, etc. In FIG. 3, there is schematically illustrated a CMOS FET device with N+ type diffusions 42 making up the N channel device and P+ type diffusions 43 making up the P channel device in the substrate 40 and polysilicon gate dielectric layer 44 and gate electrode or conductor 46 for each of these devices making up the CMOS FET structure. The gate electrode 46 may be typically polysilicon. An insulator layer 48 is deposited thereover by conventional means, such as chemical vapor deposition of silicon oxide.

The fabrication of the multilevel metallization structure begins by opening vias to the polysilicon gate electrodes 46 and substrate 40 where appropriate. FIG. 3 only illustrates an opening to the substrate in its cross-sectional view, but obviously connections are made to the gates 46. Often in the fabrication of integrated circuit devices, it is desirable and even necessary to have two or even three layers of polysilicon before the deposition of the first Metal layer M I. There is, however only shown in the FIG. 3 one layer of polysilicon Poly I, 46 for the sake of simplicity. There may of course be and usually are second layer Poly II and the third layer Poly III. There are, of course, layers of dielectric insulation layers formed between these layers after the patterning of each polysilicon layer. The resulting principal surface of the device is very nonplanar and requires a substantial planarization process. The spin-on-glass (SOG) sandwich 50, 52, 54 may be formed over the polysilicon layer before the deposition of Metal I layer M I. However, the principal planarization is usually begun after the deposition of M I as will be hereinafter described. A conductor is blanket deposited over the principal surface of the structure. Lithography and etching conventional techniques are now used to pattern the first level of metallization as shown as M I in the drawing.

The planarization at the M I level according to the present invention now begins with the deposition of a first silicon oxide layer 50 by plasma oxide or chemical vapor deposition. The first silicon oxide layer 50 is preferably formed by a plasma oxide process. The deposition should be thick enough to fully cover the M I layers so that there will be no conductor contact with the subsequent spin-on-glass layer.

Next, the first silicon oxide layer 50 is treated with the $O_2$ plasma as described above. Now the spin-on-glass layer 52 is formed. This layer 52 has the function of performing the actual planarization. The layer is formed by the deposition of one or more coating step series. Each of these coating steps include the coating deposition step of a silicate or siloxane type spin-on-glass material in a vehicle by spinning the wafer to which it has been applied. These types of materials are generally known and available. Examples of the silicate type is OCD Type 2 made by Tokyo Okha Corp. and siloxane type is OCD Type 6 made by Tokyo Okha Corp. After each coating, the wafer is baked at a temperature of less than about 350 degrees C. for about 1 to 2 minutes to drive off the solvent or vehicle from the coating. The third step in the sequence for each coating is vacuum degassing. This step is done by placing the wafer in a vacuum of less than about 100 mtorr and 350 degrees C. for at least about 20 minutes. The vacuum degassing removes all residual solvents and other chemicals that could in later processing cause cracking and corrosion of metal or polysilicon layers.

The three spin-on-glass processing steps, (spin-on-glass deposition, baking and vacuum degassing) are repeated for each of the one or more coatings until the desired thickness of layer 52 is obtained.

After the completion of the deposition of layer 52 deposition, curing of the layer 52 is accomplished by heating at between about 390 and 500 degrees C. in nitrogen for more than about 35 minutes to crosslink and stabilize the silicate or siloxane layer. Now, the SOG layer 52 can be plasma treated as described above to improve the adhesion between the SOG layer 52 and the second oxide layer 54.

The second silicon oxide or the like layer 54 of the sandwich is preferably deposited by conventional plasma enhanced chemical vapor deposition or similar process. The thickness of this layer must be great enough to completely isolate the spin-on-glass layer from the subsequently deposited conductor or metal layer M II.

Via etching is done using conventional lithography and etching techniques to make appropriate openings through the spin-on-glass sandwich 50, 52, 54 to the M I regions. This etching may be done, for example in an AME 8311 oxide etcher using $CF_4$ and $CHF_3$ etching gases.

Just before the deposition of the next level of metallization M II and after the via opening has been done, vacuum degassing is done at the less than about 100 mtorr and about 350 degree C. for more than 20 minutes and preferably less than about 10 mtorr and between about 200 and 350 degrees C. for more than about 20 minutes.

The metal, such as aluminum layer M II may now be deposited such as by sputtering, chemical vapor deposition or evaporation and then suitably patterned using conventional lithography and etching techniques.

The same processing as was described above is used for planarizing, via etching and metal deposition to complete the four level multilevel metallization structure shown in FIG. 3 wherein the subsequent metal layers are M III and M IV, and the spin-on-glass sandwich are 60 and 70. A conventional passivation layer 80 is then formed over the M IV to complete the integrated circuit device. The layer 80 could even be a spin-on-glass sandwich as described above, but this is not necessary.

The $O_2$ plasma treatment of the present invention prevents the delamination in spin-on-glass sandwiches between the first oxide layer and the spin on glass layer. The $O_2$ plasma treatment roughens the surface of the first silicon oxide layer thereby improving the adhesion of the spin on glass layer. The treatment also reduced the moisture content of the bulk first oxide layer further improving adhesion to the spin on glass layer. Experiments have shown that the $O_2$ treatment of the present invention roughens the oxide surface thereby increasing the oxide surface area by approximately 70%. Reliability tests using temperature cycling (−65° C. to 150° C.) on current technology CMOS technology have shown that the $O_2$ treatment reduces electrical failure rate caused by delamination from about 9% fails to 0% fails. Moreover, the $O_2$ treatment of the present invention can by used on sandwich structure having more than 3 layers, such as 5 layer structures (e.g., ox, SOG, ox, SOG, ox) and can be used with first silicon oxide layer formed by processes in addition to PECVD processes.

EXAMPLE 1

Shown below are the results of a temperature cycling test where the samples were cycled 300 times from −65° C. to 150° C. The samples were MOS semiconductor circuits with 68 pins packages. Approximately half the group (521 samples) did not receive the pre- SOG plasma treatment on the 1st oxide layer while the other half (540 sample) were treated with the plasma treatment of the present invention. In the conventional group (no $O_2$ plasma treatment) 51 of 521 parts failed. 16 of the 51 parts were examined and 14 of the 16 were found to have SOG delamination. For the samples with the treatment of the present invention only 3 of 540 parts failed and 0 of the 3 failing samples had SOG delaminations. This experiment shows the present invention is effective in significantly reducing or eliminating the SOG delamination problem.

TABLE 1

Experiment Results Showing $O_2$ Treatment Vs Conventional Processing

| | Elect. Fails (Fail/Qty) | Qty of Elect. Fails Examined | Qty of examined units with delamination | Comments |
| --- | --- | --- | --- | --- |
| No treatment of 1st oxide layer | 51/521 | 16 | 14 | fail |
| $O_2$ plasma treatment of the 1st oxide layer | 3/540 | 3 | 0 | pass |

EXAMPLE 2

First oxide layer 50 surfaces (prior to SOG application) were measured on an Atomic Force Microscope for samples with the $O_2$ plasma (process of the current invention) and no treatment (conventional process). The Atomic force microscope measures the first oxide roughness by measuring vertical height ($h_i$) of many points on the surface. The height measurements are used to calculate an average height ($h_{xbar}$). These measurements are used to calculate the averaged roughness (Ra) and the root mean squared roughness (RMS) as shown below:

$$Ra = \frac{\sum_{i}^{n}(h_{xbar} - h_i)}{N}$$

$$RMS = \frac{\sqrt{\sum_{i=1}^{n}(h_{xbar} - h_i)^2}}{n}$$

The result showed that the first oxide sample treated with the $O_2$ plasma of the present invention has a significantly rougher surface than the conventional (non-treated) sample.

TABLE 2

Comparison of Surface roughness between the $O_2$ plasma process of the invention and the conventional process

| | $R_{xbar}$ | RMS | $h_{max}$ |
| --- | --- | --- | --- |
| $O_2$ plasma treatment of the present invention | 1.0643 nm | 1.3545 nm | 9.404 nm |
| conventional no $O_2$ treatment | 0.8047 nm | 1.0437 nm | 9.3729 nm |

This table shows the plasma process of the invention makes the first oxide surface significantly rougher than the conventional untreated sample. This rougher first oxide surface greatly reduces the spin-on-glass to first oxide delamination problem.

While the invention has been particularly shown and described with reference to the preferred embodiments thereof, it will be understood by those skilled in the art that various changes in form and details may be made without departing from the spirit and scope of the invention. For example, while the detailed example of the integrated circuit used a MOSFET integrated circuit, it is obvious to those skilled in the are that the planarization techniques of the invention will also be applicable to bipolar, BICMOS and other types of integrated circuit devices useful in the submicrom processing field. Also, the incorporation of more than one polysilicon layer before the use of the metal layer M I is clearly useful. In this alternative, a spin-on-glass layer is useful for planarization before the M I layer is formed.

What is claimed is:

1. A method for planarization of dielectric layers between conductor layers in integrated circuit devices comprising:

providing a semiconductor substrate having devices formed within and on its surface and with at least one patterned conductive layer thereover, depositing a first silicon oxide layer over said patterned conductive layer, exposing said first silicon oxide layer to a plasma containing only oxygen ($O_2$) thereby roughening the surface of said first silicon oxide layer, covering said first silicon oxide layer with a spin-on-glass layer, baking and vacuum degassing said spin-on-glass layer, curing said spin-on-glass layer, and forming a second silicon oxide layer over said spin-on-glass layer to complete said planarization.

2. The method of claim 1 wherein said first and second silicon oxide layers are formed by a plasma enhanced chemical vapor deposition process.

3. The method of claim 1 wherein said first silicon oxide layer has a thickness in the range of about 1750 to 2250 Å.

4. The method of claim 1 wherein the exposing of said first silicon oxide layer includes exposing the surface of the first silicon oxide layer with an oxygen plasma at a temperature in the range about of 180° to 210° C.

5. The method of claim 1 wherein after the covering, baking, vacuum degassing process of said spin on glass layer, further comprising repeating said covering said first spin-on-glass layer with additional spin-on-glass layers, repeating said baking and vacuum degassing processes at least one more time.

6. The method of claim 1 wherein after the covering, baking, vacuum degassing process of said spin on glass layer, further comprising covering said spin-on-glass layer with a second spin-on-glass layer, repeating said baking and vacuum degassing processes one more time.

7. The method of claim 1 wherein said spin-on-glass layer has a thickness of about 3150 Å.

8. The method of claim 1 wherein said vacuum degassing said spin-on-glass layer at less than about 100 mtorr and about 350 degrees C before depositing a second conductor layer to avoid interface contamination between said spin-on-glass layer and said second conductor layer.

9. The method of claim 1 wherein said spin-on-glass layer is exposed to a plasma containing only oxygen prior to the forming of said second silicon oxide layer.

10. The method of claim 1 wherein the second silicon oxide layer has thickness in the range of about 4300 to 5700 Å.

11. The method of claim 1 wherein said devices are FET devices having a polysilicon gate and the conductive layer is metal.

12. The method of claim 1 wherein said devices are bipolar devices.

13. A method for planarization of dielectric layers between conductor layers in multilayer metallization of submicron integrated circuit devices comprising:

providing a semiconductor substrate having devices formed within and on its surface and with at least one patterned conductive layer thereover, depositing a first silicon oxide layer over said patterned conductive layer, exposing the surface of said first silicon oxide layer to a plasma containing only oxygen ($O_2$ at a temperature in the range of about 180° to 210° C. thereby roughening said surface of said first silicon oxide layer;

covering said first silicon oxide layer with a first spin-on-glass layer, baking, vacuum degassing and curing said first spin-on-glass layer, covering said first spin-on-glass layer with a second spin-on-glass layer, baking, vacuum degassing and curing said second spin-on-glass layer, and forming a second silicon oxide layer over said second spin-on-glass layer to complete said planarization.

14. The method of claim 13 wherein said first and second silicon oxide layers are formed by a plasma enhanced chemical vapor deposition process.

15. The method of claim 13 wherein said first silicon oxide layer has a thickness in the range of about 1750 to 2250 Å.

16. The method of claim 13 wherein said first and second spin-on-glass layers have a combined total thickness of about 3150 Å.

17. The method of claim 13 wherein said second spin-on-glass layer is exposed to a plasma containing oxygen prior to the forming of said second silicon oxide layer, thereby roughening the surface of said spin-on-glass layer.

18. The method of claim 13 wherein the second silicon oxide layer has thickness in the range of about 4300 to 5700 Å.

19. The method of claim 13 wherein the said devices are FET devices having a polysilicon gate and the conductor layer is metal.

20. A method for planarization of dielectric layers between conductor layers in integrated circuit devices comprising:

providing a semiconductor substrate having devices formed within and on its surface and with at least one patterned conductive layer thereover, depositing a first silicon oxide layer over said patterned conductive layer, treating said first silicon oxide layer with a plasma, said plasma treating of said first silicon oxide layer is performed in a barrel type photo resist striping tool, at a temperature about under 210° C. for about 15 minutes;

covering said first silicon oxide layer with a spin-on-glass layer, baking and vacuum degassing said spin-on-glass layer, curing said spin-on-glass layer, and forming a second silicon oxide layer over said spin-on-glass layer to complete said planarization.

21. The method of claim 20 wherein the treating of said first silicon oxide layer is performed in a barrel type photo resist striping tool, at a temperature between about 180° to 210° C., at a pressure of about 800 mTorr, at a power of about 500 watts, and at an $O_2$ flow of about 500 sccm for a time between about 12 to 13 minutes.

* * * * *